United States Patent [19]

Caulton

[11] 3,728,589

[45] Apr. 17, 1973

[54] SEMICONDUCTOR ASSEMBLY

[75] Inventor: Martin Caulton, Princeton, N.J.

[73] Assignee: RCA Corporation, New York, N.Y.

[22] Filed: Apr. 16, 1971

[21] Appl. No.: 134,769

[52] U.S. Cl. .........317/234 R, 317/234 A, 317/234 G

[51] Int. Cl. ..............................H01l 1/02, H01l 1/14

[58] Field of Search ....................317/234 G, 101 CP, 317/234 A, 234 H

[56] References Cited

UNITED STATES PATENTS

| | | | |
|---|---|---|---|
| 3,515,952 | 6/1970 | Robinson | 317/235 R |
| 3,611,059 | 10/1971 | Carley | 317/234 G |
| 3,387,190 | 6/1968 | Winkler | 317/234 G |
| 3,577,181 | 5/1971 | Belohoubek | 317/234 G |
| 3,478,161 | 11/1969 | Carley | 317/234 G |
| 3,176,191 | 3/1965 | Rowe | 317/101 CP |
| 3,517,272 | 6/1970 | Lee et al. | 317/101 R |
| 3,593,174 | 7/1971 | White | 317/234 H |
| 3,479,570 | 11/1969 | Gilbert | 317/234 G |

*Primary Examiner*—John W. Huckert
*Assistant Examiner*—William D. Larkins
*Attorney*—Glenn H. Bruestle

[57] ABSTRACT

A semiconductor assembly for high frequency, high power operation includes a ground plane member of a block of an electrically and thermally conductive material having a cavity in the top surface thereof. A mounting block of an electrically insulating and thermally conductive material is mounted on the ground plane member in the cavity, and a transistor element is mounted on the mounting block. The transistor element has a collector electrode on one surface which is mechanically and electrically connected to a metal film on the mounting block, and emitter and base electrodes on its other surface which are substantially coplanar with top surface of the ground plane member. A ground bar extends across the cavity adjacent the transistor element and is mechanically and electrically connected to the top surface of the ground plane member. The base electrode of the transistor element is electrically connected to the ground plane member by wires extending from the base electrode to the top surface of the ground plane member and the ground bar. Input and output tuning circuits may be mounted on the top surface of the ground plane member and electrically connected to the base electrode and collector electrode respectively.

4 Claims, 3 Drawing Figures

INVENTOR.
Martin Caulton
BY
Donald S. Cohen
ATTORNEY

INVENTOR
Martin Caulton
BY Donald S. Cohen
ATTORNEY

SEMICONDUCTOR ASSEMBLY

BACKGROUND OF THE INVENTION

The invention herein disclosed was made in the course of or under a contract or subcontract thereunder with the Department of the Army.

The present invention relates to a semiconductor assembly, and, more particularly, to a high power, microwave transistor assembly.

With the increasing use of power transistors in electrical circuits which operate at high frequencies, such as UHF and microwave frequencies, it has become necessary to design package assemblies for such transistors which permit the transistors to operate properly in such circuits. The packages for such power transistors must be capable of dissipating the relatively high quantities of heat generated by the transistor to maintain the transistor at a suitable operating temperature, i.e., a temperature which will not adversely affect the operating characteristics of the transistor. Another important characteristic for such packages is that it provides for good electrical grounding of the transistor with a minimum of parasitic inductance. To minimize the parasitic inductance it is necessary to have minimal lead lengths between the transistor and the ground. In addition, power transistors used in high frequency circuits generally include tuning circuitry and input circuitry. To minimize the physical size of the transistor assembly, minimize the electrical loss, optimize performance and maximize the bandwidth of operation it would be desirable to be able to include such additional circuitry directly in the transistor package, particularly in the form of a planar type circuitry.

SUMMARY OF THE INVENTION

A semiconductor assembly includes a ground plane member of an electrically and thermally conductive material having a cavity therein extending from a surface thereof and a semiconductor element mounted in the cavity in the ground plane member. The semiconductor element includes a body of semiconductor material having at least one electrode on a surface thereof. The semiconductor element is mounted on and thermally connected to the ground plane member with the surface of the semiconductor element being substantially coplanar with the surface of the ground plane member. The electrode of the semiconductor element is electrically connected with minimum inductance to the surface of the ground plane member.

DETAILED DESCRIPTION

Figure 1:
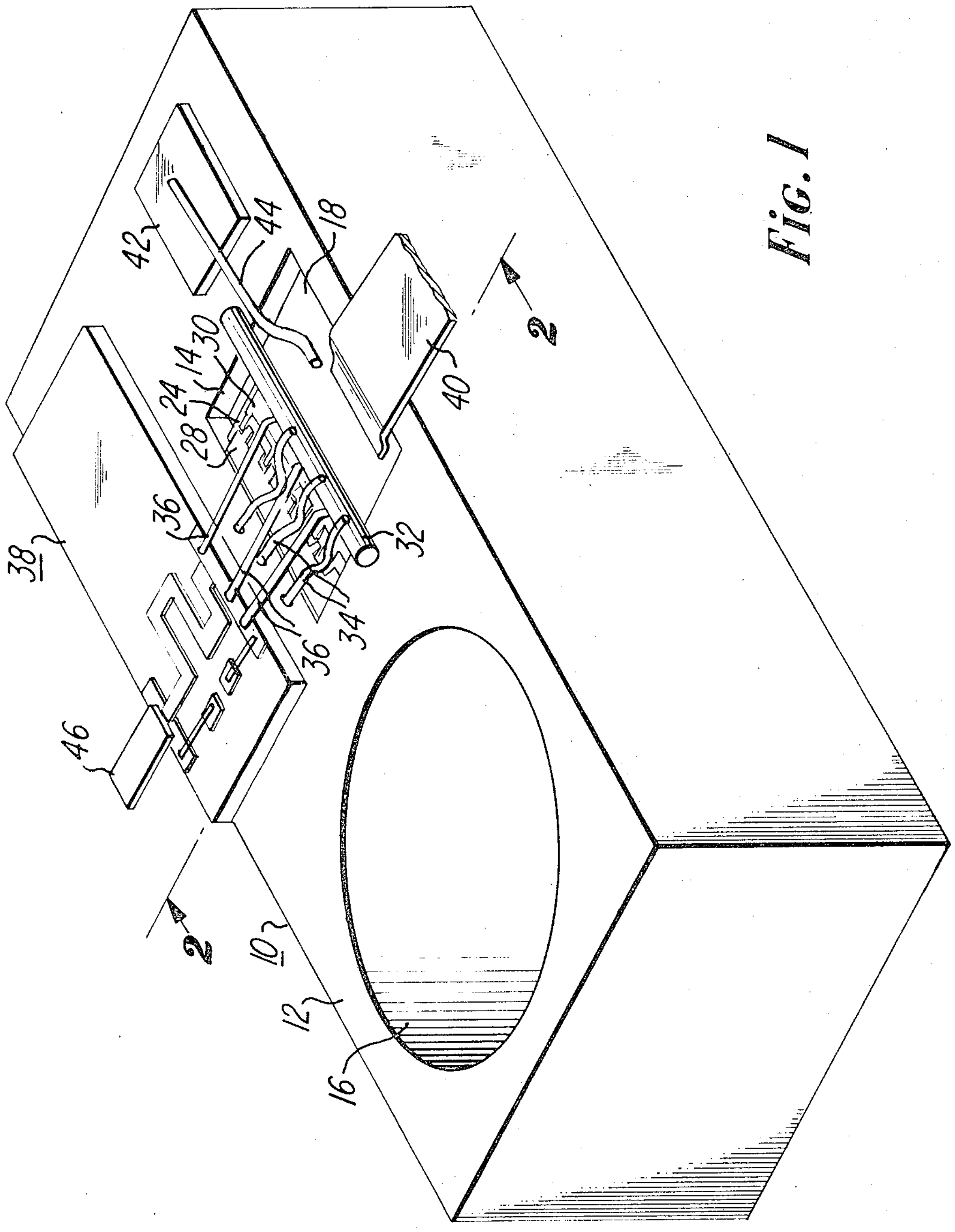
FIG. 1 is a perspective view of a form of the semiconductor assembly of the present invention.

Referring to the drawings, a form of the semiconductor assembly of the present invention is generally designated as 10. The semiconductor assembly 10 includes a ground plane member 12 having good electrically and thermally conductive characteristics. Preferably, the ground plane member 12 is a block of a good electrically and thermally conductive material, such as copper. However, the ground plane member 12 may be of a block of a good thermally conductive material, such as beryllia, which is coated on all of its surfaces with a film of a good electrically conductive material, such as gold. The ground plane member 12 has a cavity 14 in its upper surface. Although the cavity 14 is shown as being positioned adjacent a side edge of the ground plane member 12, it may be positioned anywhere in the surface of the ground plane member. A hole 16 extends through the ground plane member 12 from its top surface to its bottom surface. The hole 16 is adapted to receive a screw or similar element for securing the ground plane member 12 to a support.

Figure 2:
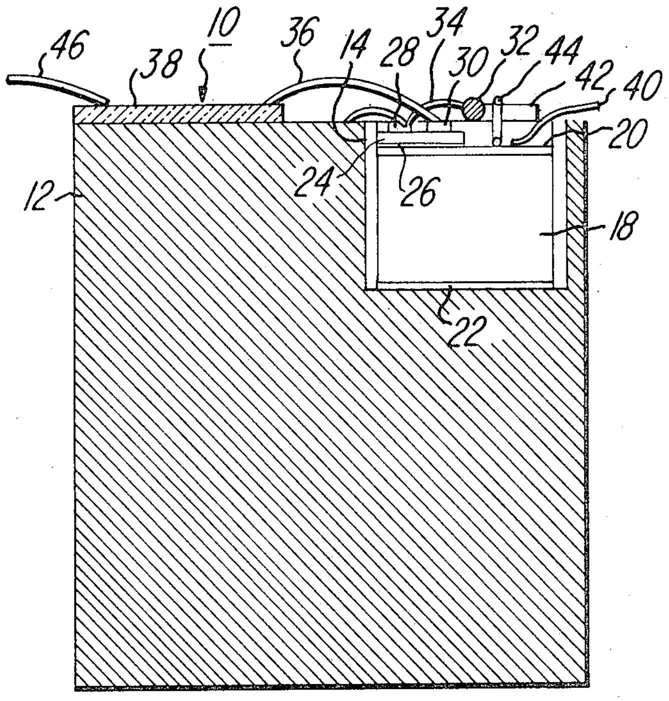
FIG. 2 is a sectional view taken along line 2—2 of FIG. 1.
Figure 3:
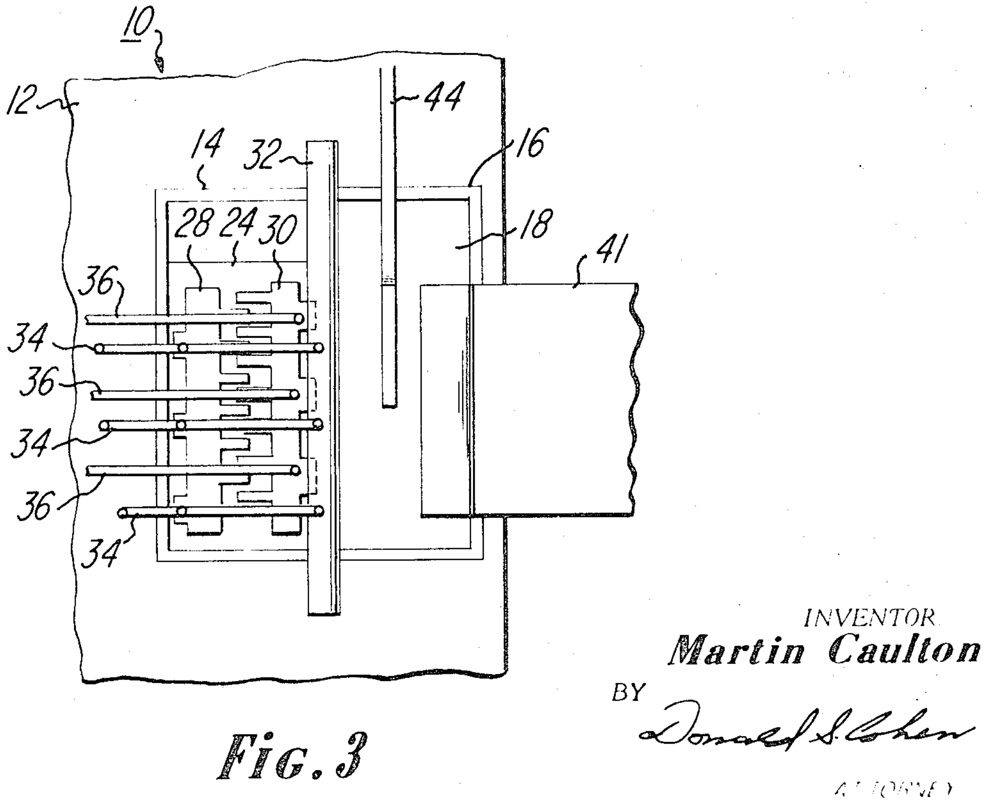
FIG. 3 is an enlarged top plan view of a portion of the semiconductor assembly.

A mounting block 18 of an electrical insulating but thermally conducting material, such as beryllia or alumina, is mounted in the cavity 14 in the ground plane member 12. As shown in FIGS. 2 and 3, the mounting block 18 is slightly smaller than the cavity 14 and is positioned in the cavity with its side walls spaced from the side walls of the cavity. As shown in FIG. 2, the top and bottom surfaces of the mounting block 18 are coated with thin films 20 and 22 of an electrically conductive metal, such as gold. The mounting block 18 is secured to the ground plane member, such as by soldering the metal film 22 on the bottom surface of the mounting block 18 to the bottom surface of the cavity 14.

A semiconductor element 24, which is a transistor, is mounted on the mounting block 18. Transistor element 24 is a flat body of a semiconductor material, such as silicon, having a pair of P-N junctions formed therein which provide base, emitter and collector electrode regions. As shown in FIG. 2, a collector electrode 26 is provided on the bottom surface of the transistor element 24 and base and emitter electrodes 28 and 30 are provided on the top surface of the transistor element. As shown in FIG. 3, each of the base and emitter electrodes 28 and 30 includes a plurality of fingers extending from one side of a bus bar and contact pads extending from the other side of the bus bar. The fingers of the electrodes 28 and 30 are interdigitated. The transistor element 24 is smaller in area than the area of the top surface of the mounting block 18 and is seated on the mounting block adjacent an edge of the mounting block, with the collector electrode 26 being juxtaposed to the metal film 20 on the top surface of the mounting block. The transistor element 24 is mechanically secured to the mounting block 18 by bonding, such as with a suitable solder, the collector electrode 26 to the metal film 20 on the top surface of the mounting block so that the collector electrode is electrically connected to the metal film 20. The combined height of the mounting block 18 and the thickness of the transistor element 24 is substantially equal to but preferably not greater than the depth of the recess 14 in the ground plane member 12. Thus, the emitter and base electrodes 28 and 30 of the transistor element 24 are substantially coplanar with the top surface of the ground plane member 12.

A ground bar 32 extends across the cavity 16 with its ends being seated on and secured to, such as by a suitable solder, the top surface of the ground plane member 12. The ground bar 32 is preferably of a relatively hard metal, such as tungsten, which is coated with a good electrically conductive metal, such as gold. The ground bar 32 is positioned as close as possible to the transistor element 24 and extends substantially parallel to the bus bar of the emitter electrode 30 of the transistor element. The base electrode 28 of the transistor element 24 is electrically connected to the ground plane member 12 by a plurality of wires 34 of an electrically conductive metal, such as gold. Each of the base wires 34 extends across the transistor element 24 with one end bonded to the ground bar 32, its other end bonded to the top surface of the ground plane member 12 and a point between its ends bonded to a separate contact pad of the base electrode 28. The wires 34 are preferably bonded to the ground bar 32, ground plane member 12 and base electrode 28 by either ultrasonic or compression bonding techniques. The ground bar 32 is of a hard metal so as to permit ease of bonding the wires thereto.

A plurality of wires 36 of an electrically conductive metal, such as gold, are each bonded at one end to a separate contact pad of the emitter electrode 30. The other ends of the base wires 36 are bonded to the output termination of an input circuit element, generally designated as 38, as will be explained. An output terminal 40 is bonded to the metal film 20 on the top surface of the mounting block so as to be electrically connected to the collector electrode 26 of the transistor element 24. As shown, the output terminal 40 is preferably a foil of an electrically conductive metal, such as gold, so as to provide a low inductance. However, the output terminal may be a wire. The wires 34 and 36 may also be replaced by metal foil to reduce stray impedances.

Power transistors used in high frequency circuits generally require input and output tuning circuits. In the form of the semiconductor assembly 10 shown, the output tuning circuit includes a capacitor 42 which is formed of two metal layers on opposite sides of a layer of silicon dioxide. The capacitor 42 is mounted on the top surface of the ground plane member 12 adjacent the cavity 14 with one of the plates of the capacitor being mechanically and electrically connected to the ground plane member, such as by a suitable solder. An electrically conductive wire 44 is bonded at one end to the other plate of the capacitor 42 and at its other end to the metal film 20 on the top surface of the mounting block 18. The wire 44 electrically connects the capacitor 42 to the collector electrode 26 of the transistor element 24, and is of a size to provide a desired impedance. Thus, the capacitor 42 and the wire 44 provide a grounded capacitance-inductance tuning circuit at the output of the output of the transistor element 24.

As shown in FIG. 1, the input circuit element 38 includes a flat plate of an electrical insulating material, such as sapphire, mounted on the top surface of the ground plane member 12. The bottom surface of the plate is coated with a metal film so as to permit the input circuit element 38 to be bonded to the ground plane member, such as with a suitable solder. The top surface of the plate is coated with a film of an electrically conductive metal, such as copper or gold, in the form of a pattern forming various passive electrical components, such as inductors and capacitors, connected in a desired electrical circuit. The emitter electrode wires 36 from the transistor element 24 are bonded to a termination area of the circuit pattern of the input circuit element 38 so that the output of the input circuit element 38 is electrically connected to the emitter electrode 30 of the transistor element. An input termination wire or foil 46 is bonded to an input termination area of the circuit pattern of the input circuit element 38.

In the semiconductor assembly 10, by mounting the semiconductor element 24 in the cavity in the ground plane member 12, the semiconductor element is in a "sea of ground" in that the ground plane extends around and under the semiconductor element. Also, this permits the semiconductor element 24 to be positioned with its upper surface being substantially coplanar with the top surface of the ground plane member 12. Thus, the electrode of the semiconductor element 24 which is to be electrically connected to ground is very close to the top surface of ground plane member 12 so that the wires making this connection are very short. Mounting semiconductor element 24 in the sea of ground and using very short wires to make the ground connection extremely minimizes any parasitic inductances in the semiconductor assembly 10. In addition, since the semiconductor element 24 is mounted on a relatively large, as compared to the size of the semiconductor element, body having good thermal conductivity, the ground plane member 12, there is provided excellent dissipation of heat from the semiconductor element. Thus, the ground plane member 12 serves as the support for the semiconductor element 24, as the electrical ground with a minimum of parasitic inductance, and as a heat sink to provide excellent dissipation of heat from the semiconductor element. This provides a semiconductor assembly 10 wherein a transistor element can be operated at microwave frequencies, at high powers with the achievement of high gains at high efficiencies. For example, a semiconductor assembly 10 having a type 2N5921 transistor was operated at a frequency of 2.25 $GH_z$ and was found to have a gain of 9 dB, with an output power of 7 watts and a collector efficiency of greater than 40 percent. In addition, the semiconductor device 10 permits any tuning circuitry in the form of lumped element, planar circuits to be mounted directly on the ground plane member. Thus, the semiconductor device 10 provides a semiconductor element which can operate at high powers and at microwave frequencies with good operating characteristics minimum added parasitic reactance and can include desired input and output tuning circuitry without substantially increasing the size of the device.

What is claimed is:

1. A semiconductor assembly comprising a ground plane member of an electrically and thermally conductive material, said ground plane member having a cavity therein extending from a surface thereof, a mounting block of an electrically insulating and thermally conductive material seated on the bottom of the cavity in the ground plane member, a semiconductor element including a body of semiconductor material having a surface and at least one electrode on said surface, said semiconductor element being mounted in said cavity on said mounting block with said surface of the semiconductor element being substantially coplanar with said surface of said ground plane member, an electrically conductive ground bar extending completely across the top of said cavity and said mounting block adjacent said semiconductor element with the ends of said ground bar being seated on and secured to said surface of the ground plane member, and means electrically connecting an electrode on said surface of the semiconductor element of both said ground bar and said surface of the ground plane member.

2. A semiconductor assembly in accordance with claim 1 in which the electrode of the semiconductor element is electrically connected to the ground plane member by a plurality of wires which extend from the electrode to both the ground bar and to said surface of the ground plane member.

3. A semiconductor assembly in accordance with claim 2 in which the semiconductor element is a transistor which includes a pair of electrodes on said surface of the body and a third electrode on a second surface of said body parallel to and spaced from said surface.

4. A semiconductor assembly in accordance with claim 3 in which the surface of the mounting block in which the semiconductor element is mounted is coated with a metal film and the third electrode of the semiconductor element is mechanically and electrically connected to said metal film.

* * * * *